United States Patent [19]

Ono et al.

[11] Patent Number: 4,570,187

[45] Date of Patent: Feb. 11, 1986

[54] METHOD FOR SCANNING AND RECORDING A PLURALITY OF ORIGINAL PICTURES SIMULTANEOUSLY

[75] Inventors: Yoshio Ono; Tetsuo Sano, both of Kyoto, Japan

[73] Assignee: Dainippon Screen Seizo Kabushiki Kaisha, Kyoto, Japan

[21] Appl. No.: 561,745

[22] Filed: Dec. 15, 1983

[30] Foreign Application Priority Data

Dec. 23, 1982 [JP] Japan ................................ 57-224892

[51] Int. Cl.[4] ..................... H04N 1/04; H04N 1/20; H04N 1/46; H04N 1/10
[52] U.S. Cl. .................................... 358/287; 358/288; 358/293; 358/75
[58] Field of Search ............... 358/288, 287, 293, 294, 358/285, 280, 75

[56] References Cited

U.S. PATENT DOCUMENTS

| 3,911,480 | 10/1975 | Brucker | 358/75 |
| 4,327,380 | 4/1982 | Yamada et al. | 358/288 |
| 4,454,537 | 6/1984 | Okada et al. | 358/287 |
| 4,470,074 | 9/1984 | Yamada | 358/287 |

Primary Examiner—James J. Groody
Assistant Examiner—John K. Peng
Attorney, Agent, or Firm—Hayes, Davis & Soloway

[57] ABSTRACT

A method for scanning and recording a plurality of original pictures by a picture reproducing machine in which desired parts of said plurality of original pictures of different reproduction magnification are simultaneously input and scanned, and at least parts of the desired portions are stored into memory so that they may be output, scanned and recorded simultaneously with different magnifications.

6 Claims, 15 Drawing Figures

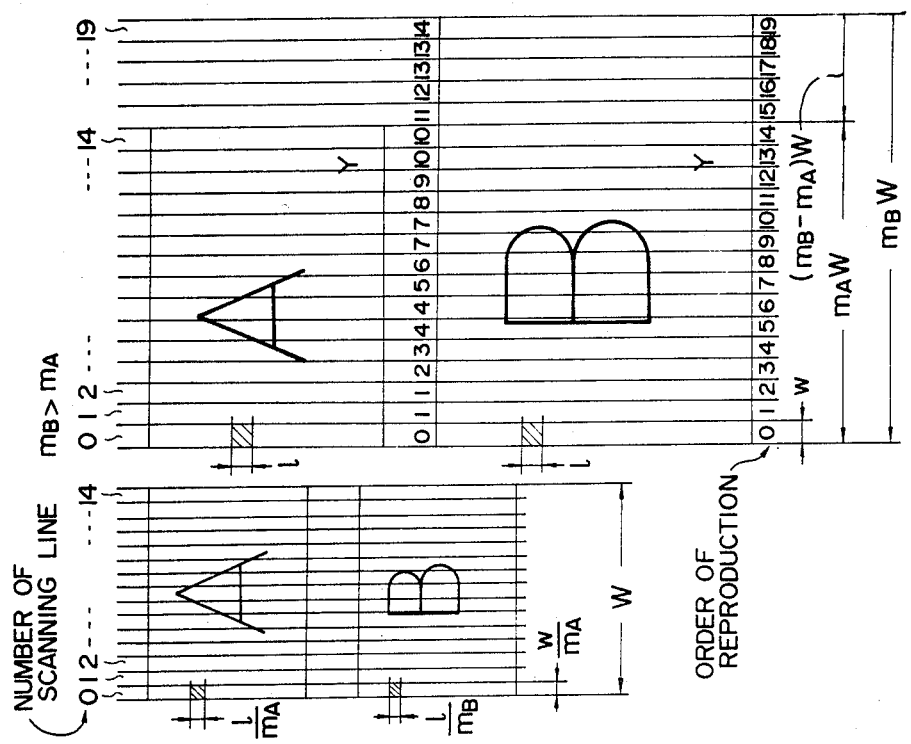
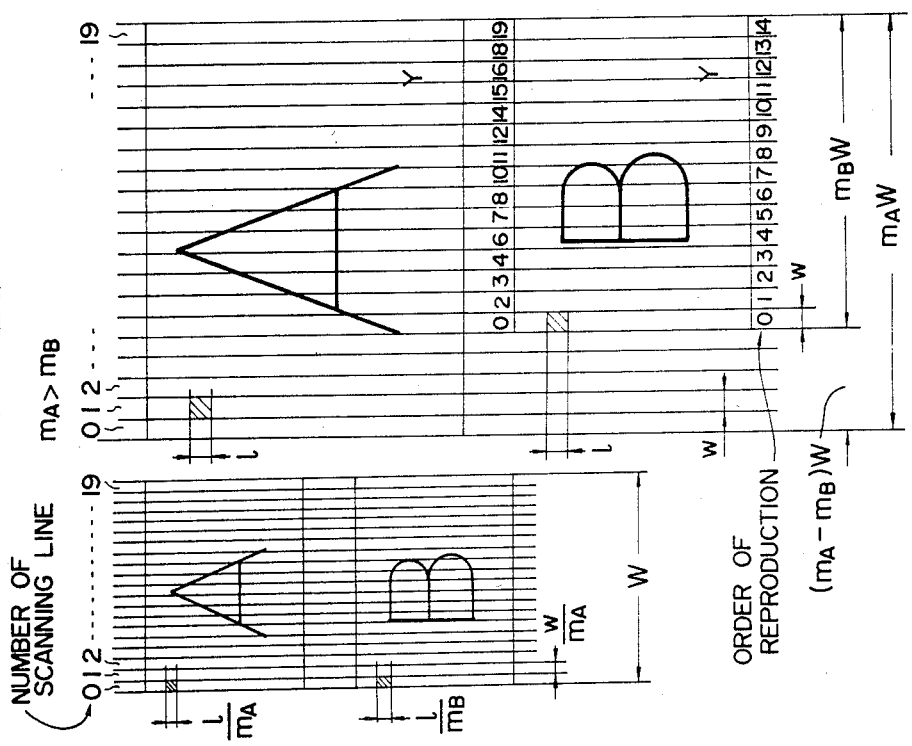

FIG.6a    FIG.6b
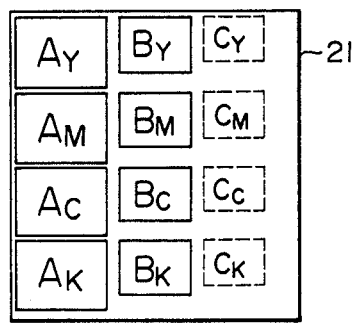  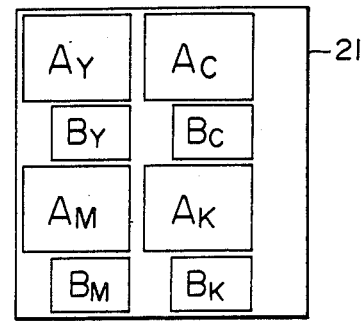
FIG.7
(a)  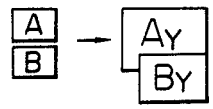    (b)  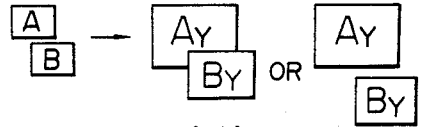
(c)  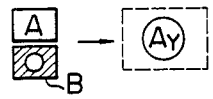    (d)  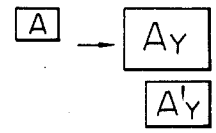
(e)  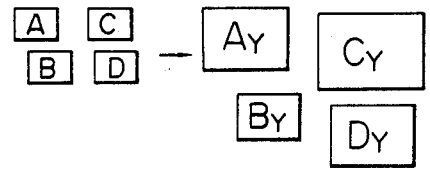
FIG.8
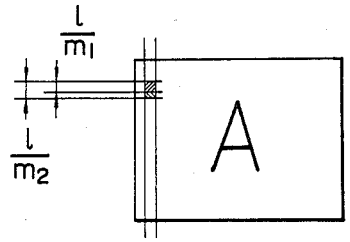

METHOD FOR SCANNING AND RECORDING A PLURALITY OF ORIGINAL PICTURES SIMULTANEOUSLY

BACKGROUND OF THE INVENTION

The present invention relates to a method for scanning and recording original pictures by a picture reproducing machine such as color scanner for plate-making etc. in operation time, and particularly relates to a method which can scan and record a plurality of pictures of different magnifications simultaneously.

In color plate-making process color scanners have been widely used, and there are two types in the color scanners among which one is a continuous tone color scanner and the other is a direct color scanner. In the former after a continuous tone color separation picture image having been produced by a color scanner, it is one of the indispensable processes to halftone screening by varying magnification such as reduction and enlargement with a process camera so that the magnification may match to a desired reproduction size. While, in the latter process for separating color, varying magnification and halftone screening can be carried out simultaneously by the scanner, so that processes of using the process camera can be omitted. Accordingly, recently the direct scanner has come to wide use instead of the former continuous tone color scanner, because of its high efficiency.

However, even in the direct scanner there is remained the following weak point, that is, on the contrary the above features the direct scanner can not scan and separate the colors of a plurality of original pictures simultaneously except for such an exceptional case in which a plurality of original pictures which are required to be same reproduction magnification of one another are given. Accordingly, usually in accordance with color tone correction conditions and magnification required for each of the original pictures, in the direct scanner scanning and recording are carried out individually.

In the case of there being a number of original pictures, a plurality of scanners are provided to cope with the increase of the amount of work. However, it is not necessarily a good policy to provide a plurality of scanners for mere increase of the number of the scanners to be equipped with results in piling up expenses for installation and increasing in required floor space which is occupied by the scanners to be installed.

SUMMARY OF THE INVENTION

In view of the afore-described status quo, it is an object of the present invention to provide a method for scanning and recording a plurality of pictures simultaneously by using color scanner, etc., whereby improving productivity, restraining the cost of equipment etc. can be brought.

For example, in case of a plurality of the original pictures being color separated, when desired reproducing magnifications of the plurality of the original pictures being different from one another, as described the above, it has been indispensably necessary for conventional direct color scanner to carry out scanning and color separation individually. However, according to the present invention a plurality of original pictures can be scanned and recorded simultaneously irrespective of difference of magnifications thereof.

BRIEF DESCRIPTION OF DRAWINGS

FIGS. 2a and 2b are illustration views of achievement of continuous variable magnification;

FIGS. 6a and 6b are output example views in case of two output heads being used;

FIGS. 7a, 7b, 7c, 7d and 7e show examples of compsite pictures;

FIG. 8 is a view illustrating the gist for obtaining reproduced picture images of plural magnifications from one original picture;

DETAILED DESCRIPTION OF THE INVENTION

With reference to the accompanying drawings, hereinafter the present invention will be described in detail.

Figure 1A:
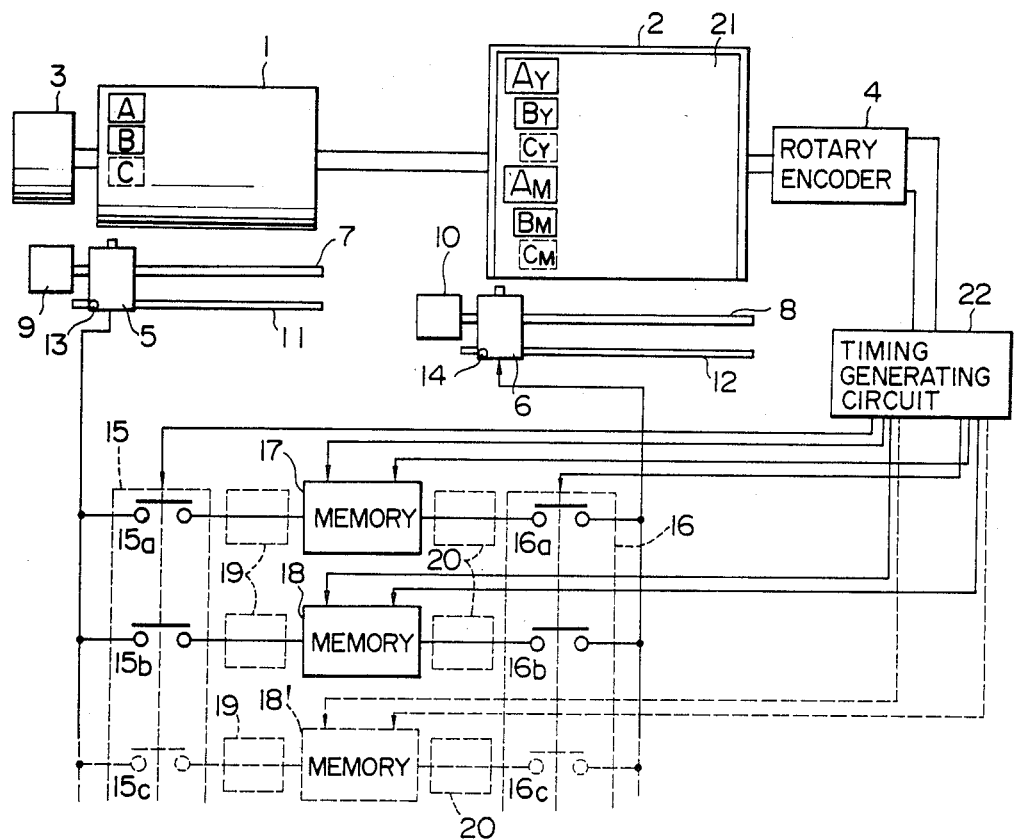
FIG. 1a is a block diagram to illustrate an embodiment of the present invention.
Figure 1B:
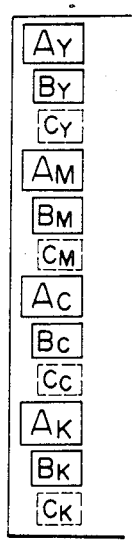
FIGS. 1b and 1c show examples of exposed records of a plurality of reproduced picture images.
Figure 1C:
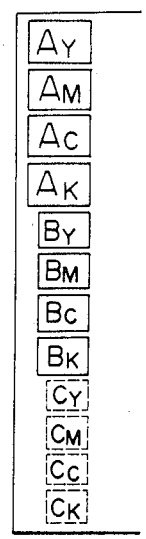

In FIG. 1a there is shown a block diagram to illustrate an embodiment of the present invention. FIG. 1b and 1c show examples in a plurality of reproduced picture images.

An original picture cylinder 1, a recording cylinder 2, a driving motor 3 and a rotary encoder 4 are constructed in coaxial relationships, so that they can rotate in the same rotation. An input head 5 is oppositely disposed to the original picture cylinder 1 and rotated by a feed screw 7 which is driven by a sub-scanning motor 9 so that it may move by keeping opposite disposition relation with the original picture cylinder 1. An output head 6 is also oppositely disposed to the recording cylinder 2 and when a feed screw 8 is rotated with a sub-scanning motor 10, it moves by keeping the oppositely disposed relation with the recording cylinder 2.

Picture information of both original pictures "A" and "B" wound onto the cylinder 1 is converted to electric signals at the input head, and these picture signals of each of the original pictues are stored in memory 17 and 18 through a changing-over switch 15.

The memory part for the original picture "A" is sufficient to have capacity which can store all information on one scanning line in the main scanning direction, and in the sub-scanning direction no storing capacity is necessary.

Nextly, by the picture signals read out of the memory part and passed through a changing-over switch 16 the output head is controlled, accordingly, desired reproduction picture images are exposed and recorded in a film 21 wound onto the recording cylinder 2. With respect to a method for carrying out reproducing operation in various magnifications to each of the original pictures, the explanation will be accompanied hereunder.

A picture image processing operation part 19 or 20 which carries out correction of color tone etc. regarding the picture signals may be disposed at the input side or the output side with respect to memory 17 and 18 as shown by a dotted line.

Input timing of the picture signals to the changing-over switches 15 and 16 and the memories 17 and 18, and timing of outputs which output from the changing-over switches 15 and 16 and the memories 17 and 18 are adjusted so that they coincide with timing pulses generated by a timing generating circuit 22 by basing on f-th pulses which are generated in equi-timing within a period of one pulse generated from the encoder every one rotation of the cylinder.

Linear encoder 11 and 12 and detectors 13 and 14 are necessary for detecting positions in the sub-scanning direction of the input heads 5 and 6 which will be described hereinafter.

In FIGS. 2a and 2b there are shown methods for achieving different magnifiaction with respect to two original pictures.

In FIGS. 2a and 2b two method for reproducing the original pictures "A" and "B" shown at the left side in the same figures by desired different magnifications $m_A$ and $m_B$ simultaneously are shown, in which FIG. 2a shows the case of $m_A > m_B$, and FIG. 2b shows the case of $m_A > m_B$ by making the magnification $m_A$ to be reference.

Firstly, description of a variable magnification method regarding the rotational direction (hereinafter refer to the main scanning direction) is given hereunder.

Figure 3:
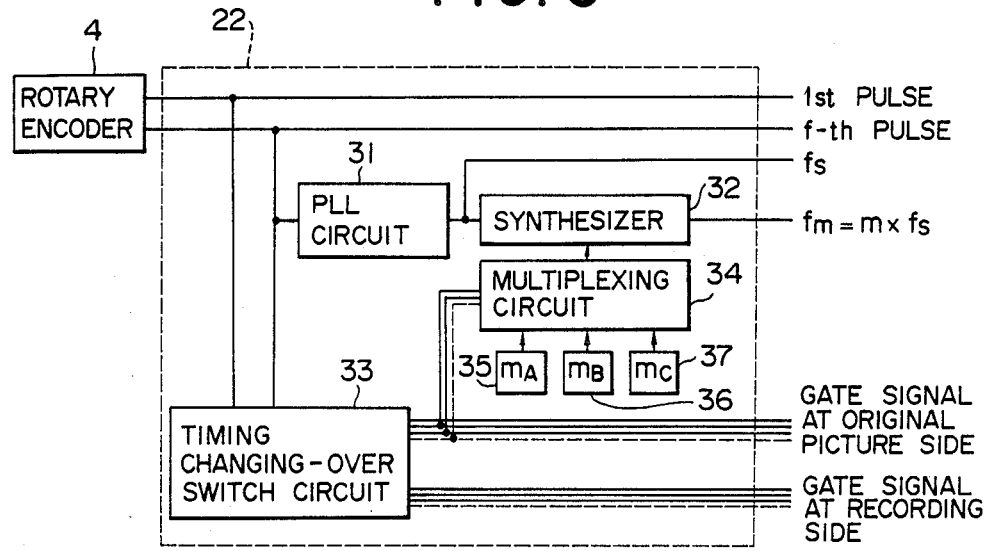
FIG. 3 is a view showing a part of a timing generating circuit.

Each of picture signals corresponding to respective lengths of and $1/m_A$ and $1/m_B$ of one picture element in the main scanning direction of the original pictures "A" and "B" shown in FIG. 2 is sampled, and input to the memories 17 and 18. When the signals are output from the memories 17 and 18 to expose onto the film, each of the lengths $1/m_A$ and $1/m_B$ exposed and recorded as the length l, that is, the ratio of the input to the output is the same as that between the desired magnifications $m_A$ and $m_B$ Nextly, a method for obtaining respective sampling lengths of each of picture elements $1/m_A$ and $1/m_B$ of the original pictures "A" and "B" will be explained hereinafter. In FIG. 3 there is shown a part of the timing generating circuit 22.

The F-th pulse generated from the encoder 4 is converted to a frequency $f_s$ through a PLL circuit 31, and is further converted to a frequency $f_m = m \times f_s$ through a synthesizer 32. Here, period $1/f_m$ is expressed by the following operation; that is, $1/f_m = 1/(m \times f_s)$. The period $1/f_m$ corresponds to each of picture elements of $1/m_A$ and $1/m_B$ of the above described respective original pictures, and $1/f_s$ corresponds to the length l which is same in each of the original pictures.

On the other hand, basing on one pulse and the F-th pulse generated by the rotary encoder 4, in a timing changing-over switch circuit 33 comprising a counter and a coincidence circuit, gate pulses are generated according to the positions of the original pictures in the main scanning direction and input to a multiplexing circuit 34.

In the multiplexing circuit 34 there are provided magnification setup means 35, 36, ... are provided. Each of these magnification setup means 35, 36, ... inputs respective magnification signals $m_A$, $m_B$, ... to the multiplexing circuit 34 according to each predetermined values. Then, each of the magnification signals $m_A$, $m_B$, ... is selectively changed-over suitably by the gate pulse and input to the synthesizer 32. The synthesizer 32 outputs, in response to the values of those input magnification signals $m_A$, $m_B$, ..., timing pulse of frequencies $f_{mA}$, $f_{mB}$, ..., and in the case of the original picture "A" being scanned, with length corresponding to one picture element $/m_A$, and in the case of the original picture "B" being scanned, with length corresponding to one picture element $/m_B$, the picture signal is sampled and input to the memory 17 and 18.

With reference to FIGS. 2a and 2b a variable magnification method in the direction toward which the input head 5 and the output head 6 disposed oppositely to the cylinders move (hereinafter the direction is referred as sub-scanning direction) will be explained.

Firstly, description will be given with respect to the original picture "A" shown in FIGS. 2a and 2b; the motors 9 and 10 are respectively controllably driven so that each of widths of removal in the scanning direction of the respective input head 5 and the output head 6 may be $W/m_A$ and W, respectively. Thus, any desired magnification in the sub-scanning direction can be obtained. To achieve this a known conventional technique can be applied, but this is not the gist of the present invention, so that no explanation will be given.

However, to obtain desired magnification in the sub-scanning direction on the original picture "B" shown in FIG. 2a and 2b, a novel method is applied. That is, the original picture "A" is input and scanned by the single input head 5 together with the original picture "B", so that regarding the sub scanning direction in FIGS. 2a and 2b assuming that the original pictures "A" and "B" are input and scanned by a sub-scanning width coincided with the magnification $w/m_A$ of the original picture "A", with respect to the original picture "B" partial neglect and/or thinning out of the picture information are carried out in the case of $m_A > m_B$, and in case of $m_A < m_B$ partial overlapping of the picture information is carried out to obtain the desired magnification $m_B$.

In this case input scanning operation is carried out by such a minute scanning pitch that any distortion occurred in the reproduced picture image by partially neglecting and/or omitting or thinning out or by partially overlapping the picture information can be visually neglected or permitted.

Figure 4:
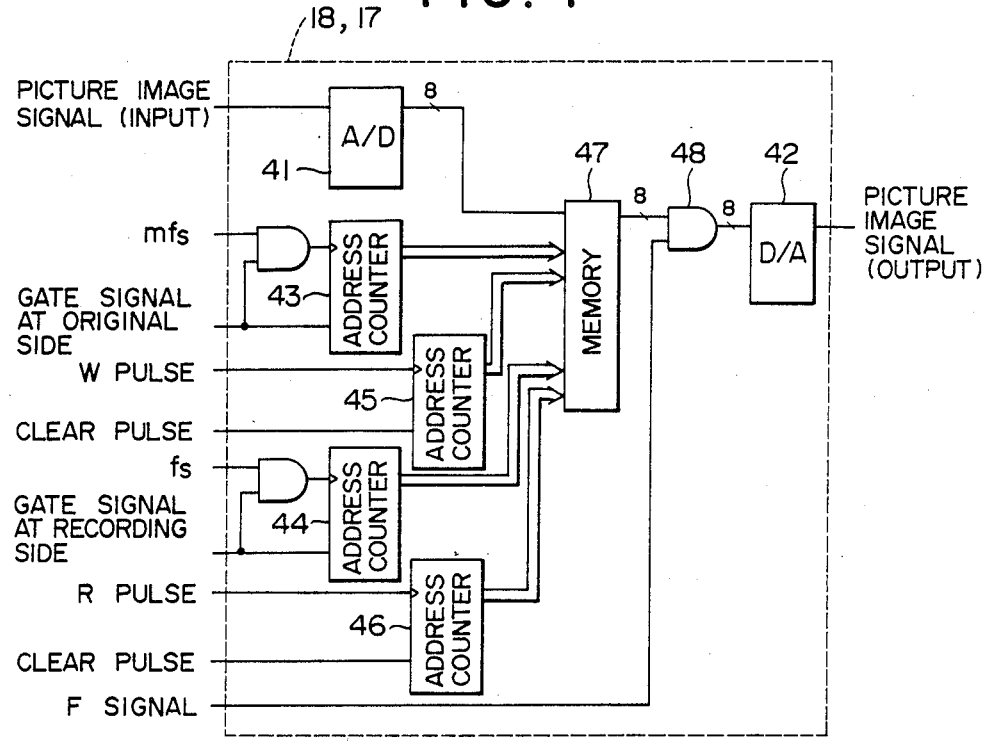
FIG. 4 is a view showing a part of a memory used in the present invention.

FIG. 4 is a partial block diagram of the memories 17 and 18 of the present invention.

The picture signal is converted at a sampling frequency of $mf_s$ to a 8 bit digital signal by an analog-digital converter 41 (hereinafter referred to ADC), and stored every one picture element in a memory 47.

Timing of this writing operation is as follows; that is, after having reset an address counter 43 in the main scanning direction at the original picture side by a gate signal generated from the timing generating circuit 22, a counter 43 counts the number of frequency $mf_s$ generated by the synthesizer 32 shown in FIG. 3 to designate an address in a memory 47 to store the input picture signal.

While, at the recording side an address counter 44 in the main scanning direction at the recording is reset by the gate signal generated from the timing generating circuit 22, then counts the number of pulse of a frequency of $f_s$ generated in the synthesizer 32 in FIG. 3 and designate an address in a memory 47, then the picture signal is read out.

The signal is converted to an analog signal by a digital-analog converter 42 (hereinafter refer to ADC) through an AND gate 48, and output therefrom. Writing and reading in the main scanning direction are always carried out as afore-described manner.

As shown in FIG. 2a, at first in an area $(m_A - m_B)W$ at the output picture side in the sub-scanning direction, the picture "B" is not output, but picture signals are accumulately stored in the memory 47. While being in the area $(m_A - m_B)W$, an F signal shown in FIG. 4 is set to "L" state by calculating with an arithmetic unit which is not shown (hereinafter refer to the CPU). The F signal is turned to "H" state after passing through the area $(m_A - m_B)W$, then the AND gate 48 is opened and the picture signal is output via the DAC 42.

In the case of $m_A > m_B$ shown in FIG. 2a, partial neglect and/or thinning out of the picture information are performed as follows: That is, in essential average thinning out is carried once per $m_A/(m_A - M_B)$ by the CPU control or the like. To make it easy to understand, in accordance with FIG. 2a we will explain the thinning out operation as follows by putting $m_A = 2m_B = 1.5$, and assuming that the operation is to be performed as once per $2/(2 - 1.5) = 4$.

Firstly, calculation has been done previously or is carried out in response to every one rotation of the cylinder by the CPU, and an input pulse (hereinafter refer to W pulse) of an address counter 45 in the sub-scanning direction at the original picture side shown in FIG. 4 is generated or not. That is, the picture information of the scanning number "0" of the original picture "B" shown in FIG. 2a is written into the memory 47. The CPU generates W pulse and then the counter 45 counts a counting value "1".

Though the picture information of the subsequent scanning line number "1" is written into the memory, the CPU does not generate the W pulse. And when the picture information of the subsequent scanning line number "2" is written into the memory 47 in the state of the counted value 1 of the counter 45 being remained, the previously written information of the scanning line number "1" is rewritten to be substituted for the picture information of the scanning line number "2" and disappeared.

Accordingly, it results in that neglect and thinning out of the picture information in the sub-scanning direction have been performed, and the picture information of the scanning line number "2" is written into the address "1" in the sub-scanning direction of the memory 47.

After then, the CPU generates the W pulse and turns the counting number of the counter 45 to "2". Hereafter the above described operation is repeated and thus writing of the original picture "B" is performed in the manner of thinning out once at every $m_A/(m_A - m_B)$ times.

Hereinafter, reading operation is described as follows:

The F signal is turned to the "H" state, when the picture signal passes through the range of the area $(m_A - m_B)W$, and reading operation is performed at the address "0" in the sub-scanning direction of the memory 47, and picture information with respect to the scanning number "0" of the original picture "B" is output via the AND gate 48 and the DAC 42. After then, the CPU generates an R pulse every on rotation of the cylinder to increase count of the counter 46 and picture information of subsequent scanning lines is exposed and recorded in consecutive order. Accordingly, required capacity of the memory 47 must be at least such a value as deserves to the width of the value of $(m_A - m_B)W$ in the scanning direction.

Nextly, in the case of $m_A < m_B$ shown in FIG. 2b, partial overlapping of the picture information is carried out as explained hereinafter.

That is, as having been already illustrated in FIG. 2a, overlapping is carried out once per $m_B/(m_B - M_A)$ times. To make easy to understand hereunder explanation will follow by putting $m_A = 1.5$ and $m_B = 2$.

The CPU performs calculation once per every rotation of the cylinder or prior to every one rotation thereof, after having turned the F signal to "H" state, and generates a W pulse every one rotation of the cylinder. Thus, the picture information is written to the memory 47 successively. When the main scanning operation over the whole width of the original picture "B" finishes, the CPU ceases to generate the W pulse.

On the other hand, at the reading-out side at every one rotation of the cylinder the R pulse is generated, and the picture information is read out from the memory according to the order of having been written thereinto to be exposed and recorded in turn.

In accordance with caluculation of the CPU, when generation of R pulse is stopped, the same picture information is read out and partial overlappings is achieved.

When the main scanning separation over the whole width of the original picture "B" is finished, in the sub-scanning direction the picture information of the original picture "B" equivalent quantity to $(m_B - m_A)W$ must be stored in the memory 47.

According to the present invention, in the memory 47 the information is read out according to the order of having been written therein, so that it is unnecessary to store all the picture information over the whole width of the original, but the picture information of the maximum $|m_A - m_B|W$ may be stored in the memory 47 so that the address may be circulated. As the memory 47 of the above described, for example, memory means of the type of first-in, first-out method in which addresses are sequentially varied can be utilized.

In the embodiment of the present invention explained the above, regarding the two original pictures, the color separation picture image by one color or by two colors may be output simultaneously, but as a developed color separation picture film shown in FIGS. 1b and 1c, to apply a well known four color simultaneous recording technique in the main scanning direction is convenient. In principle even from a plurality of original pictures within the range of less than the circumferential length four color simultaneous recording can be performed.

Figure 5A:
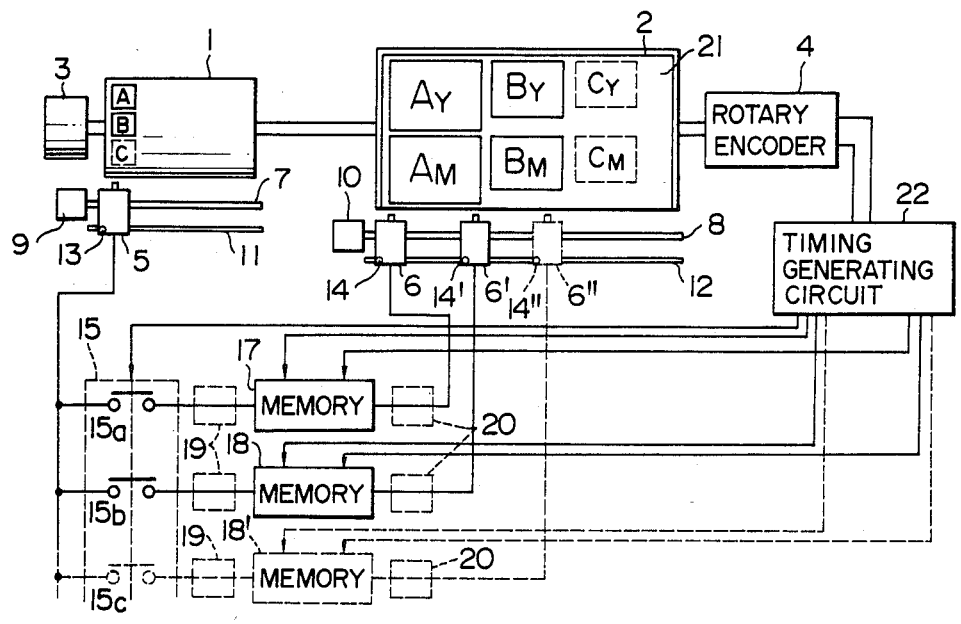
FIGS. 5a and 5b are views showing examples in which a plurality of output heads are used.
Figure 5B:
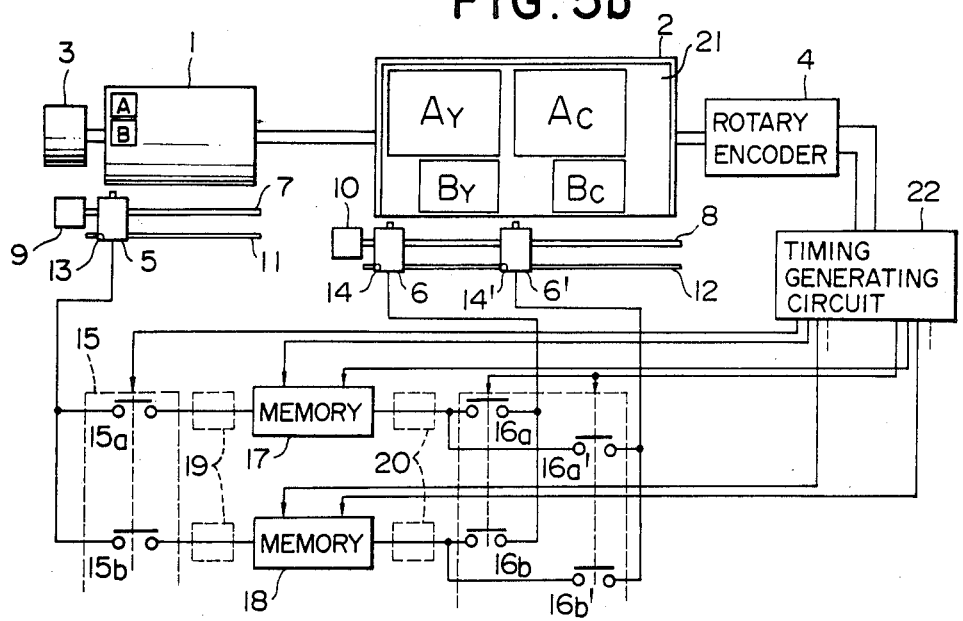

In another embodiment of the present invention, as shown in FIG. 5, by providing a plurality of output heads the rate of operation can be also improved with a smaller sized apparatus.

In FIG. 6 there are shown output examples in case of two output heads being provided, and the example shown in FIG. 6b can cope with requisite of larger magnification range than that of the example shown in FIG. 6a.

As an output example (only Y plate) shown in FIG. 7a, overlapped reproduction in order of priority also can be performed.

In FIG. 1b and FIG. 6b it is shown that four color plates are separately recorded in each of the original pictures "A" and "B". And there are provided a plurality of memories in the apparatus, so that if gate signals of the output side of the timing changing-over switching circuit 33 are set up appropriately.

The output example shown in FIG. 7b is the reproduction picture which are moved in the sub-scanning direction. In case of the linear encoders 11 and 12 and the detectors 13 and 14 are provided to the input and the output parts, the reproduced pictures can be moved in the sub-scanning direction by controlling the counter 46. For the prevention of increasing of the memory capacity of the memory 47, it may be also good that previously the set position of the original picture is appropriately moved in the subscanning direction. Explanation to this will be given together with an example shown in FIG. 7e.

An output example of FIG. 7c shows that if it is suggested that the original picture "B" has binary signals of white and black, a cutout reproduction picture can be obtained.

An output example of FIG. 7d shows that reproduction pictures of different magnifications can be obtained simultaneously from one original picture.

The changing-over switch 15a and 15b shown in FIG. 1 are simultaneously closed. With respect to the sub-scanning direction the description given regarding FIG. 2 should be referred.

Figure 9:
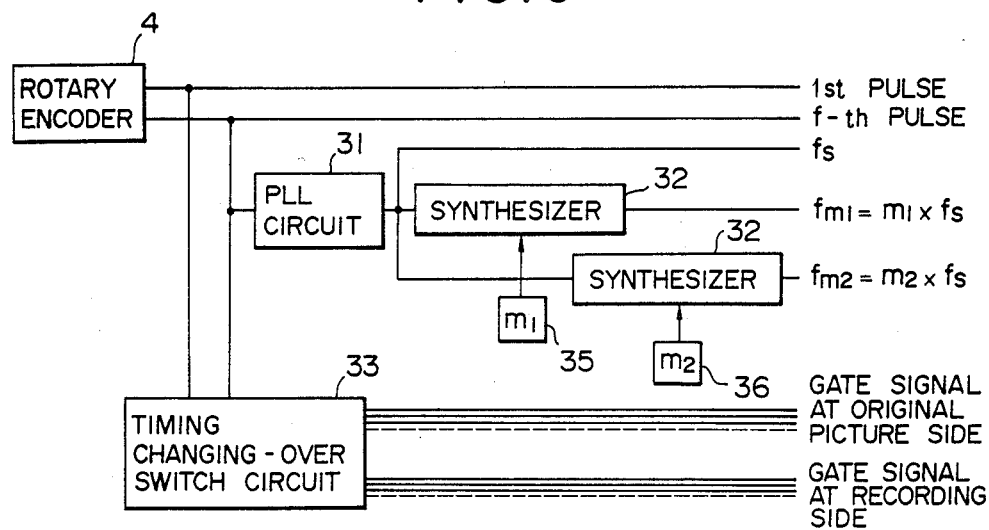
FIG. 9 is a view showing a plurality of synthesizers being provided.

An ingenious contrivance is needed to output in the main scanning direction, that is, as shown in FIG. 8, by setting each one picture element of the original picture side to $1/m_1$ and $1/m_2$ the picture information is stored in the memory parts 17 and 18. For the purpose of storing the picture information, as described the above, instead of one synthesizer shown in FIG. 3, two synthesizers 32, as shown in FIG. 9, are used to generate always two kinds of timing pulses corresponding to two magnifications in parallel, and by applying each of frequencies $(m_1 f_s)$ and $(m_2 f_s)$ to the memory parts 17 and 18, respectively, each of length of the respective one picture element is set to $1/m_1$ and $1/m_2$, respectively.

Of course, the above described method may be applied not only to such apparatus of the construction shown in FIG. 1, but also to such apparatus that have a plurality of output parts as shown in FIG. 5.

An output example shown in FIG. 7e is also provided with layout function.

It is preferable that in the case of utilizing actually the method of the present invention to consider all given original pictures with their relations between size (considering also trimming) and desired magnification and determine which of the original pictures should be scanned simultaneously to acquire the highest efficiency (for example, it is desired that those original pictures which have considerably similar sizes and magnifications should be scanned simultaneously). Thus, it is desired to apply the original pictures onto the original picture cylinder with desired layout. And to determine the layout CPU can be utilized.

In addition, the appratus of the embodiments according to the present invention can output picture images on each of the position according to desired layout regarding each of the original pictures of the recorded films, and then it is also possible to perform trimming as desired.

To achieve the above described object, particularly with respect to the embodiment shown in FIG. 5, it is preferable to make size of the recording cylinder larger in circumferential direction. Even in this case it is also possible to limit memory capacity of the memory to relatively smaller one by obtaining with a digitizer etc. positional information of the reproduction picture "A", "B", "C", and "D" and inputting the positional information into the CPU to define suitable applying positions of the original pictures "A", "B", "C" and "D" on the original cylinder.

Nextly, explanation for setting up the reference magnification will follow. As shown in FIG. 7e, in case of the number of the memory 47 being increased to be required for a plurality of original pictures, or in case of there being two original pictures, setting the reference magnification does not necessarily coincide with the desired value required by one of the original pictures, and it is also impossible to set up the intermediate magnification value of the desired magnifications of more than two original pictures.

In principle, it is further possible to set up the reference magnification value higher than any of the desired magnification values or lower than any of the desired ones. However, in this case in the memory part for the original picture "A" there is required an extra memory capacity in the sub-scanning direction.

It is preferable that the corresponding number of picture image processing operation parts 19 and 20 to the maximum of the original pictures to be simultaneously input and scanned are provided.

For example, assuming that the maximum number of the original picture is two, it is desired to set up operation conditions previously set to each of the original pictures by providing well-known two analogical operational circuits which utilize the well-known look up table memory.

Figure 10:
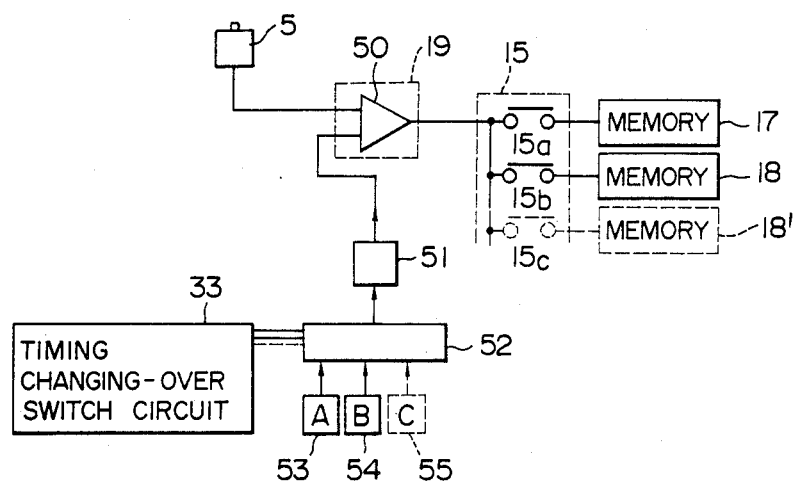
FIG. 10 is a wiring diagram showing a commonly applied operation part.

Of course, it is also possible to use one operational part commonly. In FIG. 10 there is shown an embodiment of a method in which the picture image processing operation part 19 or 20 is commonly used regarding those embodiments shown in FIGS. 1, 5a and 5b as possible as can be used.

The circuit shown in FIG. 10 comprises a digital-analog converter (DAC) 51, a multiplexing circuit 52, original picture condition setup means 53, 54, ....

An electric picture signal coming from the input head 5 inputs to one of analog parts 50 in the operation part 19 (for the sake of simplicity only one of operation means is shown). In case of the conditions of the original pictures "A", "B", ... being input to the multiplexing circuit 52 one of which inputs is the output of the timing changing-over switch 33, the conditions of the original pictures are input to the DAC 51 with a timing corresponding to the timing with which each of the picture signals is input, and to other inputs of the analog operation means the output from the DAC is input.

Thus, operation processing conditions are changed-over, and the picture signals from the input head 5 are processed according to the conditions being set up each of the original pictures. And the picture signals are output to the memories 17 and 18 via the changing-over switch 15.

For converting magnification in the main scanning direction other methods may be also applied. To each of the recording cylinder and the original picture cylinder a motor and a rotary encoder are mounted, and for the original picture "A" to achieve its desired magnification $m_A$, the number of rotation of the original picture cylinder is set to $1/m_A$ times of that of the recording cylinder, and length of picture element per unit time "t" is also multiplied by $1/m_A$ to obtain length of $1/m_A$. Thus, the well-known method (refer to the Japanese Patent Publication No. 52-26413; Patentee is the Applicant of this application) is applied thereto.

The recording cylinder is constantly rotated, and by exposing and recording with one picture element length "l" per unit time "t", desired magnification can be obtained.

On the other hand, regarding the original picture "B", by generating a timing signal of $m_A/m_B$ times of the unit time "t", and defining one picture element length to $1/m_B$ by multiplying $1/m_A$ by $m_A/m_B$, by m, the desired magnification can be obtained. Same as the above described, regarding the main scanning direction another magnification conversion method can be also applied. The method is a known method (refer to the Japanese Patent Laid-Open Publication No. 52-131366 filed by the applicant) in which one picture element of the original picture is made constant, and length of one picture element in recording time is also the same as that of the original picture, and partial neglect and thinning out or partial overlapping are carried out to obtain desired magnification.

In the case in which any one of the above described methods for converting magnification in the main scanning direction is selected, the same method regarding in the sub-scanning direction described heretofore may be applied.

As the memory 47 any semiconductor memory may be used, but when, in particular, a memory having larger memory capacity is needed, the larger part thereof may be replaced with a magnetic disc device. In this case it is also possible to provide semiconductor buffer memories in front and in the rear stages of the magnetic disc device, and at the same time in order to achieve functions of writing into the disc device and reading out of it in parallel, a plurality of magnetic disc devices may be also equipped.

Any devices such as having laser light, canon lamp, LED etc. as a light source may be used as the output head 6, and in the case of halftone recording either an output head of contact screen type or that of for a dot generator may be adopted. But the output head for the dot generator of well-known type in which a plurality of gas laser light fluxes are separated in parallel and controlles to turn on and off is too expensive, so that those which utilize a plurality of semiconductor lasers have much advantageous features, particularly such a type of the embodiment shown in FIG. 5 which has a plurality of output heads.

The above explanations have been given to the case in which drum or cylinder rotation scanning is performed, but even in case of flat plane scanning the method of the present invention can be applied. Regarding color original pictures and/or mono-color original pictures, and even regarding combination of the both the present invention can be applied.

What is claimed is:

1. A method for simultaneously inputting and scanning a plurality of original pictures comprising the steps of:
    disposing a plurality of original pictures in a main scanning direction;
    inputting and scanning simultaneously desired portions said plurality of original pictures in said main scanning direction;
    storing information derived from said original pictures in respective different memories according to desired reproduction magnifications;
    reading sequentially said information of each said original picture from said respective memories in the main scanning direction, according to the reproduction magnifications; and
    outputting, scanning and recording said information with said different reproduction magnifications.

2. A method according to claim 1 wherein said inputting and scanning step is perfomed by a single input head.

3. A method according to claim 1 wherein said outputting and scanning step are preformed by a single output head.

4. A method according to claim 1, wherein said outputting and scanning are preformed by a plurality of output heads which output and sub-scan said desired portions at an identical feeding speed.

5. A method according to claim 1, wherein said desired portions are output to respective predetermined positions of a plurality of reproduced pictures and scanned to be recorded thereon.

6. A method according to claim 1, wherein a plurality of reproduced pictures of different reproduction magnifications are output from an original picture and scanned to be recorded.

* * * * *